United States Patent

Iura

[11] Patent Number: 5,697,090
[45] Date of Patent: Dec. 9, 1997

[54] SHF CONVERTER

[75] Inventor: Toshiyuki Iura, Tokyo, Japan

[73] Assignee: NEC Corporation, Toyko, Japan

[21] Appl. No.: 617,305

[22] Filed: Mar. 18, 1996

[30] Foreign Application Priority Data

Mar. 20, 1995 [JP] Japan .................. 7-060885

[51] Int. Cl.$^6$ .................................................. H04B 1/26
[52] U.S. Cl. .................. 455/316; 455/296; 455/313; 455/318; 455/323; 331/176; 333/219.1; 333/234
[58] Field of Search .................. 455/226.1, 230, 455/255, 257, 296, 310, 311, 313, 316, 317, 318, 319, 323, 337, 343, 325; 331/176, 69; 333/219.1, 234, 229

[56] References Cited

U.S. PATENT DOCUMENTS

| | | | |
|---|---|---|---|
| 4,618,836 | 10/1986 | Gannon et al. | 331/176 |
| 4,985,687 | 1/1991 | Long | 331/69 |
| 5,233,319 | 8/1993 | Mizan et al. | 333/219.1 |
| 5,428,326 | 6/1995 | Mizan et al. | 333/219.1 |
| 5,613,231 | 3/1997 | Morey | 455/318 |

*Primary Examiner*—Reinhard J. Eisenzopf
*Assistant Examiner*—Doris To
*Attorney, Agent, or Firm*—Scully, Scott, Murphy & Presser

[57] ABSTRACT

An SHF converter with less change in local oscillation frequency due to change in ambient temperature. The SHF converter is at least equipped with a low noise amplifier 1; a local oscillator circuit 5 with a dielectric resonator 13; a frequency converter 3; and a power-supply stabilizing IC, characterized in that a temperature sensing section 7 for sensing the temperature of the surroundings is placed near a metal cavity 12 housing the dielectric resonator 13, a first power-supply stabilizing IC 6a is placed at such a position as to accomplish efficient transfer of its generated heat to the metal cavity 12, while a second power-supply stabilizing IC 6b is placed at such a position that transfer of its generated heat to the metal cavity 12 is impeded, and a switch control section 8 and a selector switch 9 are also provided to switch activation between the first and the second power-supply stabilizing ICs 6a and 6b in a manner concordant with the temperature sensing section 7.

4 Claims, 4 Drawing Sheets

SHF CONVERTER

DETAILED DESCRIPTION OF THE INVENTION

1. Field of the Invention

The present invention relates to an SHF converter, and more particularly to a BS-receiving SHF converter.

2. Description of the Prior Art

As illustrated in FIG. 3, a conventional SHF converted is constructed with a low noise amplifier circuit 1, a local oscillator circuit 5 with a dielectric resonator 13, a frequency converter 3 for frequency conversion of signals from the low noise amplifier circuit 1 by output from the local oscillator circuit 5, and a power-supply stabilizing IC 6 which stabilizes a power-supply voltage from an outside source. Also, as shown in FIG. 4, the dielectric resonator 13 is housed in a metal cavity 12, and is designed so as to vary the frequencies of signals outputted from the local oscillator circuit 5 by changing the distance between a frequency adjusting screw 14 screwed in the metal cavity 12 and the dielectric resonator 13. Materials with appropriate coefficients of linear expansion are selected for the construction thereof so that the distance between the metal cavity 12 and the screw of the frequency adjusting screw 14 does not change depending on the ambient temperature.

In addition, since the output level of the local oscillator circuit 5 decreases as the ambient temperature increases, the power-supply stabilizing IC 6 is conventionally placed at such a position that transfer of heat generated by the power-supply stabilizing IC 6 to the local oscillator circuit 5 is impeded.

SHF converters, usually placed outdoors, have a wide operating temperature range extending from −30° C. to +50° C. With SHF converters of the prior art, since the power-supply stabilizing IC is placed at such a position that transfer of heat generated by the power-supply stabilizing IC to the local oscillator circuit is impeded as mentioned above, the temperature surrounding the local oscillator circuit changes dramatically depending on the outdoor temperature. The metal cavity housing the dielectric resonator and the frequency adjusting screw screwed in the metal cavity are made of materials having appropriate coefficients of linear expansion so that the distance between the dielectric resonator and the frequency adjusting screw does not change depending on the ambient temperature. The distance between the frequency adjusting screw and the dielectric resonator is kept constant only in cases where the length of the portion of the frequency adjusting screw located in the metal cavity, toward the dielectric resonator, has a specific value. In cases where the length of that portion becomes different from the specific value due to change in the ambient temperature, the difference results in change in the distance between the frequency adjusting screw and the dielectric resonator. With SHF converters practically used, the oscillation frequency of the local oscillator circuit is often different from an expected local oscillation frequency, the oscillation frequency of the local oscillator circuit is adjusted by screwing in or out the frequency adjusting screw. This adjustment of course results in various deviations in the distances between the frequency adjusting screw and the dielectric resonator from the specific value mentioned above, and with some SHF converters, the deviations may increase dramatically in cases where the ambient temperature influences the distances between the frequency adjusting screw and the dielectric resonator, thus causing the problem of increased change in the frequencies of signals outputted from the local oscillator circuit.

In addition, the output level of the local oscillator circuit decreases as the ambient temperature increases. For this reason, the power-supply stabilizing IC is placed at such a position that transfer of heat generated by the power-supply stabilizing IC to the local oscillator circuit is impeded in order to prevent lower output level of the local oscillator circuit at increased temperatures. At lower temperatures, however, since the local oscillator circuit is placed at such a position that transfer of heat generated by the power-supply stabilizing IC thereto is impeded, the metal cavity and the frequency adjusting screw undergo thermal shrinkage, and this causes the problem of change in the local oscillation frequency.

SUMMARY OF THE INVENTION

According to the present invention, there is provided an SHF converter equipped with a low noise amplifier circuit for amplifying signals from a BS antenna; a local oscillator circuit with a dielectric resonator; a frequency converter which subjects the signals from the low noise amplifier circuit to frequency conversion by output from the local oscillator circuit; and a power-supply stabilizing IC which stabilizes a power-supply voltage from an outside source, characterized in that the dielectric resonator is housed in a metal cavity, and are provided near the metal cavity a temperature sensing section for sensing the temperature of the surroundings, and two power-supply stabilizing ICs, of which the first power-supply stabilizing IC is placed at such a position as to accomplish efficient transfer of its generated heat to the metal cavity, while the second power-supply stabilizing IC is placed at such a position that transfer of its generated heat to the metal cavity is impeded, and further comprising a switch control section and a selector switch for switching activation between the first power-supply stabilizing IC and the second power-supply stabilizing IC in a manner concordant with the temperature sensing section, and a diode for preventing back-flow of current to the output end of the first power-supply stabilizing IC and to the output end of the second power-supply stabilizing IC.

DETAILED DESCRIPTION OF THE PREFERRED EMBODIMENTS

Figure 1:
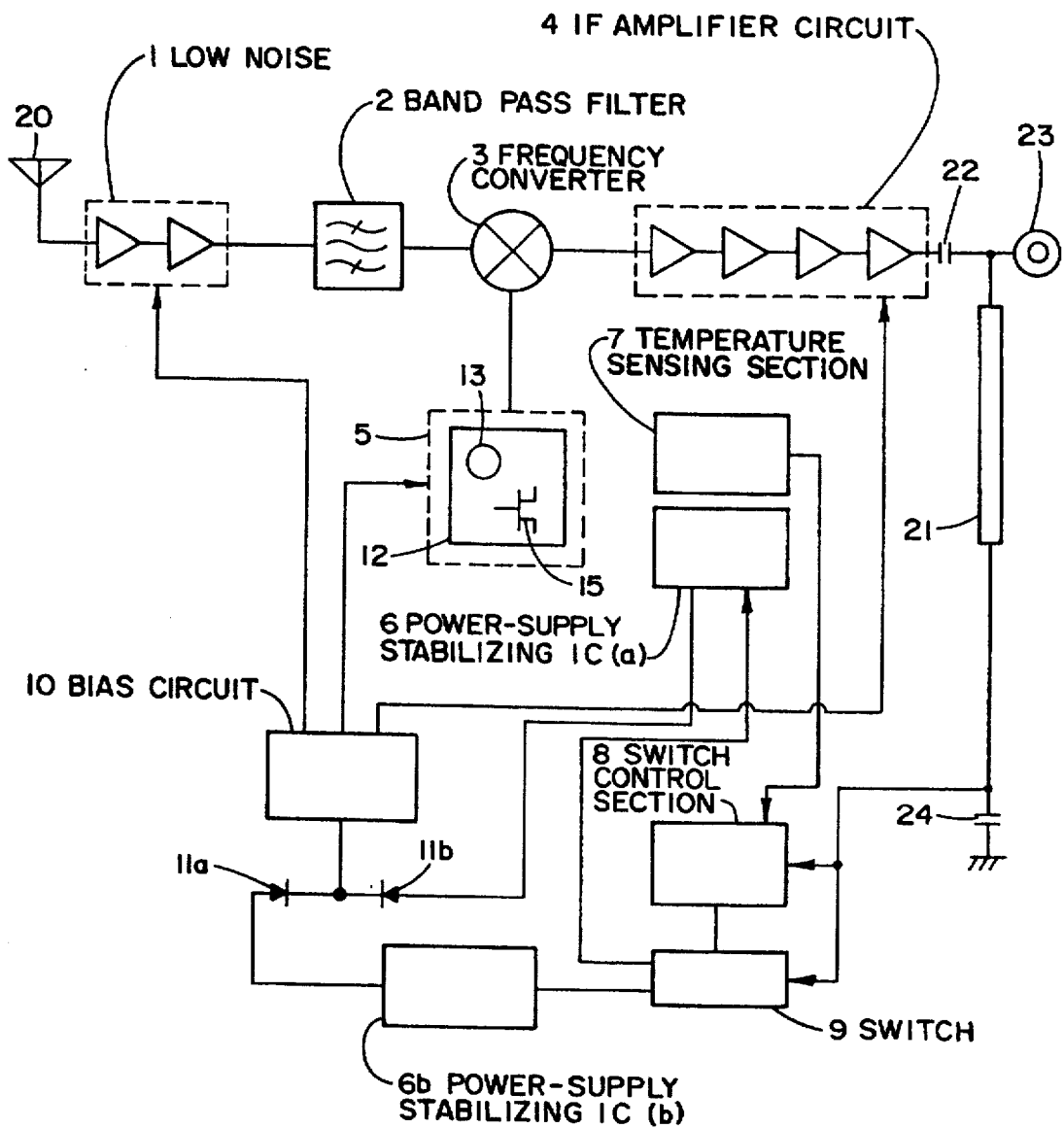
FIG. 1 is a block diagram of an embodiment of the present invention.
Figure 2:
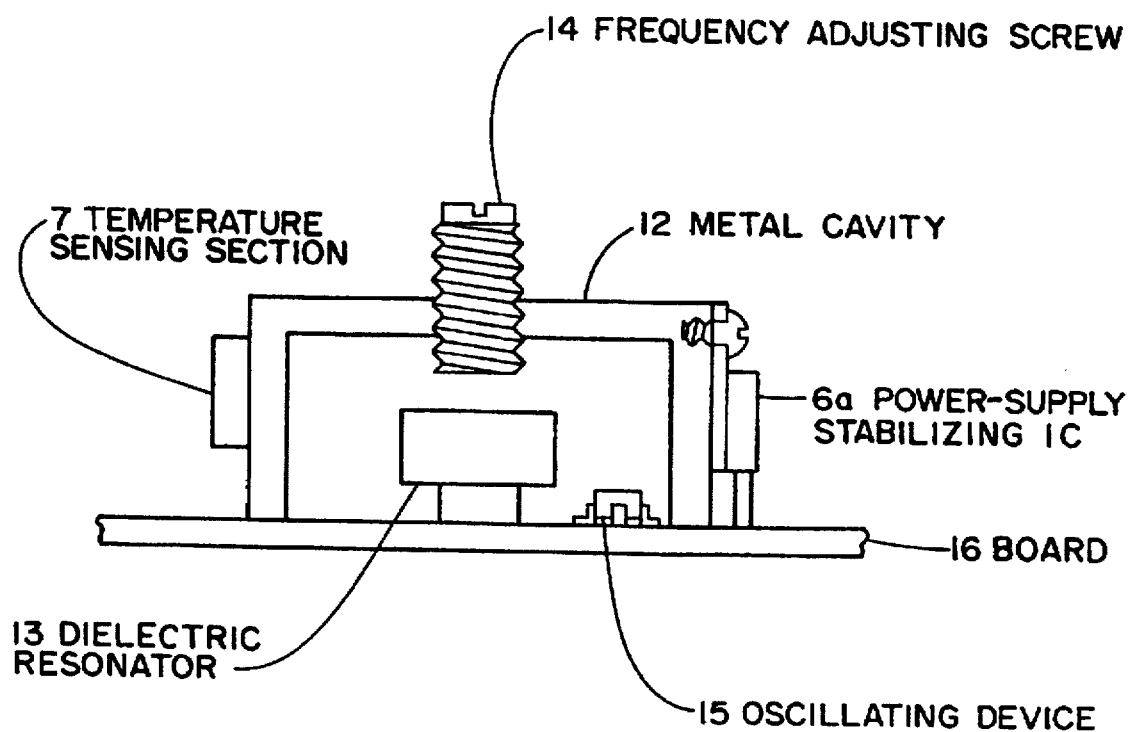
FIG. 2 is a cross sectional view of a local oscillator circuit according to the present invention.
Figure 3:
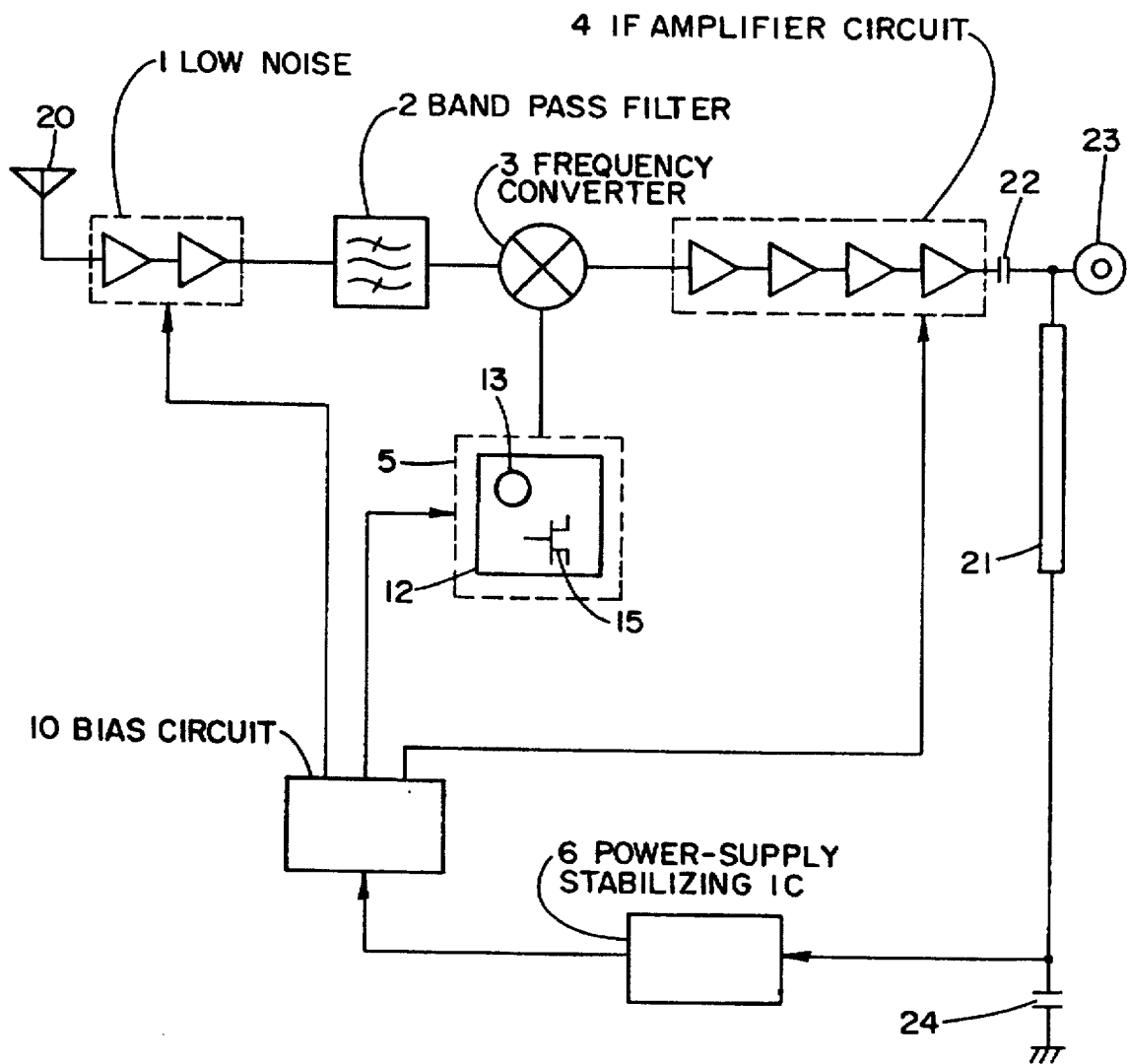
FIG. 3 is a block diagram illustrative of a conventional SHF converter.
Figure 4:
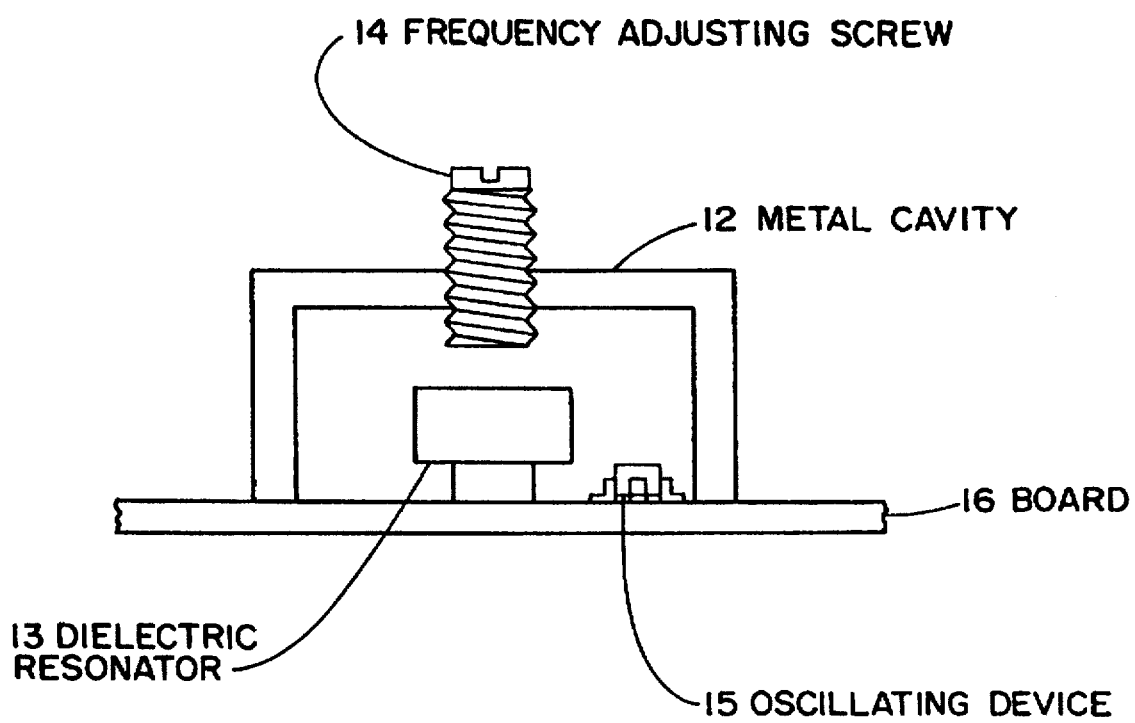
FIG. 4 is a cross sectional view of a conventional local oscillator circuit.

The present invention will now be explained with reference to the drawings. FIG. 1 is a block diagram of an SHF converter according to an embodiment of the present invention, and FIG. 2 is a view illustrative of details of the metal cavity section. This SHF converter is equipped with a low noise amplifier circuit 1 which amplifies signals from a BS antenna; an IF amplifier circuit 4 for amplifying signals from a local oscillator 3 by signals from a dielectric resonator 13; and a first power-supply stabilizing IC 6a and a second power-supply stabilizing IC 6b for stabilizing a power-supply voltage from an outside source. As shown in FIG. 2, the dielectric resonator 3 is housed in a metal cavity 12 with a frequency adjusting screw 14 screwed therein, and are provided near the metal cavity 12 a temperature sensing section 7, and a first power-supply stabilizing IC 6a placed at such a position as to accomplish efficient transfer of its generated heat to the metal cavity 12 and the frequency adjusting screw 14, while a second power-supply stabilizing IC 6b is placed at such a position that transfer of its generated heat to the metal cavity 12 and the frequency adjusting screw 14 is impeded, and further there are provided a switch control section 8 and a selector switch 9 for switching activation between the first power-supply stabilizing IC 6a and the second power-supply stabilizing IC 6b in a manner concordant with the temperature sensing section 7, and diodes 11a and 11b for preventing back-flow of a current to the output end of the first power-supply stabilizing IC 6a and to the output end of the second power-supply stabilizing IC 6b.

The switch control section 8 controls the switch 9 so as to establish a connection between the second power-supply stabilizing IC 6b and an outside power-supply source when ambient temperature is higher than the set temperature (e.g., 10° C.), and controls the switch 9 so as to establish a connection between the first power-supply stabilizing IC 6a and the outside power-supply source when the temperature indicated by the temperature sensing section is lower than the set temperature mentioned above.

As described above, according to the present invention, in cases where ambient temperature is lower than the set temperature (e.g., 10° C.), the metal cavity and the frequency adjusting screw 14 are heated by heat generated by the first power-supply stabilizing IC 6a to thermally expand the metal cavity 12 and the frequency adjusting screw 14, whereas since no current is fed through the first power-supply stabilizing IC when the ambient temperature is higher than the set temperature (e.g., 10° C.), no heat is generated by the first power-supply stabilizing IC 6a, and thus the metal cavity 12 and the frequency adjusting screw 14 are expanded only by the ambient temperature. Therefore, the amounts of change in thermal expansion of the metal cavity 12 and the frequency adjusting screw 14 which is caused by change in the ambient temperature are controlled to minimize the amount of change in the distance between the frequency adjusting screw 14 screwed in the metal cavity 12 and the dielectric resonator 13, thus minimizing change in the frequency of signals from the local oscillator circuit 5.

What is claimed is:

1. An SHF converter comprising:
   a low noise amplifier circuit;
   a local oscillator circuit with a dielectric resonator; a frequency converter which subjects signals from said low noise amplifier circuit to frequency conversion by output from said local oscillator circuit;
   two power-supply stabilizing circuits for stabilizing a power-supply voltage from an outside source to supply power to said circuits, of which the first power-supply stabilizing circuit is placed at such a position as to accomplish efficient transfer of its generated heat to the metal cavity, while the second power-supply stabilizing circuit is placed at such a position that transfer of its generated heat to the metal cavity is impeded;
   a temperature sensing section provided near a metal cavity housing said dielectric resonator to sense the temperature of the surroundings; and
   a switch for switching activation between said first power-supply stabilizing circuit and said second power-supply stabilizing circuit in a manner concordant with said temperature sensing section.

2. An SHF converter as claimed in claim 1, wherein said first power-supply stabilizing circuit is screwed in said metal cavity.

3. An SHF converter as claimed in claim 1, wherein said switch functions so as to activate said second power-supply stabilizing circuit at temperatures higher than a given temperature, and to activate said first power-supply stabilizing circuit at temperatures lower than the given temperature.

4. An SHF converter as claimed in claim 1, wherein diodes are provided at output ends of said first and second power-supply stabilizing circuits to prevent back-flow of current.

* * * * *